(12) United States Patent
Bell et al.

(10) Patent No.: US 10,020,316 B2
(45) Date of Patent: Jul. 10, 2018

(54) SPLIT-GATE SEMICONDUCTOR DEVICE WITH L-SHAPED GATE

(71) Applicant: Cypress Semiconductor Corporation, San Jose, CA (US)

(72) Inventors: Scott Bell, San Jose, CA (US); Chun Chen, San Jose, CA (US); Lei Xue, Saratoga, CA (US); Shenqing Fang, Sunnyvale, CA (US); Angela Hui, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/433,848

(22) Filed: Feb. 15, 2017

(65) Prior Publication Data
US 2017/0162586 A1 Jun. 8, 2017

Related U.S. Application Data

(63) Continuation of application No. 14/450,727, filed on Aug. 4, 2014, now Pat. No. 9,589,805.

(51) Int. Cl.
| H01L 27/1157 | (2017.01) |
| H01L 21/28 | (2006.01) |
| H01L 29/423 | (2006.01) |
| H01L 29/49 | (2006.01) |

(52) U.S. Cl.
CPC .... *H01L 27/1157* (2013.01); *H01L 21/28282* (2013.01); *H01L 29/42344* (2013.01); *H01L 29/42376* (2013.01); *H01L 29/4916* (2013.01)

(58) Field of Classification Search
None
See application file for complete search history.

(56) References Cited

U.S. PATENT DOCUMENTS

| 6,091,104 A | 7/2000 | Chen |
| 6,746,920 B1 | 6/2004 | Wen et al. |

(Continued)

FOREIGN PATENT DOCUMENTS

WO 2014093490 A1 6/2014

OTHER PUBLICATIONS

German Office Action for Application No. 112015003603.2 dated Jun. 28, 2017; 10 pages.

(Continued)

*Primary Examiner* — Long Pham

(57) ABSTRACT

A semiconductor device having a substrate, a dielectric layer over the substrate, a first gate conductor, an inter-gate dielectric structure and a second gate conductor is disclosed. A gate dielectric structure is disposed between the first gate conductor and the dielectric layer, and may include two or more dielectric films disposed in an alternating manner. The inter-gate dielectric structure may be disposed between the first gate conductor and the second gate conductor, and may include two or more dielectric films disposed in an alternating manner. The second gate conductor is formed in an L shape such that the second gate has a relatively low aspect ratio, which allows for a reduction in spacing between adjacent gates, while maintaining the required electrical isolation between the gates and contacts that may subsequently be formed.

21 Claims, 11 Drawing Sheets

(56) References Cited

U.S. PATENT DOCUMENTS

| | | | |
|---|---|---|---|
| 7,396,723 B2* | 7/2008 | Kim | H01L 27/11568 257/499 |
| 8,058,162 B2 | 11/2011 | Onda | |
| 9,589,805 B2 | 3/2017 | Bell et al. | |
| 9,691,883 B2* | 6/2017 | Chen | H01L 29/66825 |
| 2004/0077144 A1* | 4/2004 | Hsieh | H01L 27/115 438/257 |
| 2004/0207025 A1 | 10/2004 | Chiba et al. | |
| 2015/0064905 A1 | 3/2015 | Tsai | |

OTHER PUBLICATIONS

JPO Office Action for Application No. 2016-568413 dated Jun. 13, 2017; 3 pages.

International Search Report for International Application No. PCT/US2015/043237 dated Oct. 23, 2015; 2 pages.

USPTO Advisory Action for U.S. Appl. No. 14/450,727 dated Jan. 29, 2016; 4 pages.

USPTO Final Rejection for U.S. Appl. No. 14/450,727 dated Nov. 12, 2015; 7 pages.

USPTO Non-Final Rejection for U.S. Appl. No. 14/450,727 dated Jun. 22, 2015; 6 pages.

USPTO Notice of Allowance for U.S. Appl. No. 14/450,727 dated Apr. 27, 2016; 7 pages.

USPTO Notice of Allowance for U.S. Appl. No. 14/450,757 dated Nov. 21, 2016; 5 pages.

Written Opinion of the International Searching Authority for International Application No. PCT/US2015/43237 dated Oct. 23, 2015; 5 pages.

JPO Office Action for Application No. 2016-568413 dated Nov. 7, 2017; 4 pages.

* cited by examiner

SPLIT-GATE SEMICONDUCTOR DEVICE WITH L-SHAPED GATE

CROSS-REFERENCE TO RELATED APPLICATIONS

This application is a continuation of U.S. patent application Ser. No. 14/450,727, filed Aug. 4, 2014, all of which is incorporated by reference herein in its entirety.

TECHNICAL FIELD

This disclosure relates generally to improved semiconductor memory devices and methods for making such devices.

RELATED ART

The storage capacity of a memory device depends on a number of memory cells included in the memory device, while the physical size of the memory device depends on the proximity of the memory cells to one another. It is usually desirable to either increase the storage capacity of the memory device while keeping the physical size of the memory device unchanged, or decrease the physical size of the memory device while keeping the storage capacity of the memory device unchanged. Either of these two cases may be achieved by minimizing the spacing between adjacent memory cells in a memory array, while concurrently providing adequate spacing for electrical contacts and maintaining the required electrical isolation between the adjacent memory cells and the electrical contacts. However, the spacing between adjacent memory cells is limited by the aspect ratio of the gates of the memory cells. The lower the aspect ratio of the adjacent gates, the closer the gates can be to each other.

What is needed are semiconductor devices and methods for manufacturing them that result in memory cells having gates of relatively low aspect ratio such that the spacing between the adjacent cells can be minimized, while maintaining the required electrical isolation between the gates and the contacts.

SUMMARY

According to various embodiments, a method of manufacturing, an integrated circuit device and its resulting structure are described. According to an example method, a dielectric layer is formed on a substrate and a gate stack is formed on the dielectric layer. The gate stack may include a first gate conductor and a gate dielectric structure between the first gate conductor and the dielectric layer. The gate dielectric structure can include two or more dielectric films disposed in an alternating manner. An inter-gate dielectric structure can be formed at a sidewall of the gate stack, wherein the inter-gate dielectric structure can include two or more dielectric films disposed in an alternating, manner. An L-shaped second gate conductor can be formed adjacent to the inter-gate dielectric structure and on the dielectric layer.

A semiconductor device is also described. The semiconductor device may include a substrate, a dielectric layer over the substrate, a first gate conductor, an inter-gate dielectric structure and a second gate conductor. A gate dielectric structure may be disposed between the first gate conductor and the dielectric layer, and may include two or more dielectric films disposed in an alternating manner. The inter-gate dielectric structure may be disposed bet the first gate conductor and the second gate conductor, and may include two or more dielectric films disposed in an alternating manner. The second gate conductor may be formed in an L shape such that the second gate has the above-described relatively low aspect ratio, which allows for a reduction in spacing between adjacent gates, while maintaining the required electrical isolation between the gates and contacts that may subsequently be formed.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
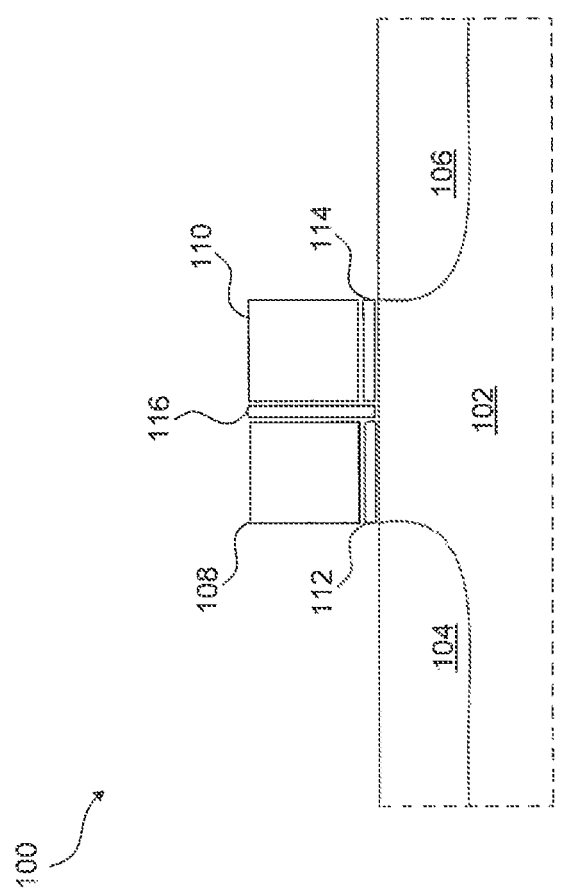
FIG. 1 depicts a cross-section of a split-gate memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

According to certain embodiments, when etching a material, at least a portion of the material remains behind after the etching process is completed. In contrast, when removing a material, all or substantially all of the material is removed in the removal process.

In the teachings contained herein, various regions of a substrate upon which devices are fabricated are mentioned. It should be understood that these regions may exist anywhere on the substrate and furthermore that the regions may not be mutually exclusive. That is, in some embodiments, portions of one or more regions may overlap. It should be understood that any number of regions may exist on the substrate and may designate areas having certain types of devices or materials. In general, the regions are used to conveniently describe areas of the substrate that include similar devices and should not limit the scope or spirit of the described embodiments.

In embodiments, the terms "forming," "form," "deposit," or "dispose" refer to the act of applying a layer of material to the substrate or another layer of material. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

In embodiments, the term "substrate" refers to silicon. However, the substrate may also be any of a wide array of semiconductor materials such as germanium, gallium arsenide, indium phosphide, etc. In other embodiments, the substrate may be electrically non-conductive such as a glass or sapphire wafer.

In embodiments, "mask" may comprise any appropriate material that allows for selective removal (or etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates a split-gate non-volatile memory cell 100. Memory cell 100 is formed on a substrate 102, such as silicon. Substrate 102 is commonly p-type or p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108, which is formed adjacent to a memory gate 110. Each gate may comprise a gate conductor such as a doped polycrystalline silicon ("poly") layer formed by well-known, for example, deposit and etch techniques to define the gate structure. Select gate 108 is disposed over a dielectric layer 112. Memory gate 110 is disposed over a dielectric 114 having one or more dielectric layers. In one example, dielectric 114 includes a charge-trapping silicon nitride layer sandwiched between two silicon dioxide layers to create a three-layer stack collectively and commonly referred to as "oxide/nitride/oxide" or "ONO." Other dielectrics may include a silicon-rich nitride film, or any film that includes, but is not limited to, silicon, oxygen, and nitrogen in various stoichiometrics. An inter-gate dielectric 116 is disposed between select gate 108 and memory gate 110 for electrical isolation between the two gates. In some examples, inter-gate dielectric 116 and dielectric 114 are the same dielectric, while other examples form one dielectric before the other (e.g., they can have different dielectric properties). As such, inter-gate dielectric 116 need not include the same film structure as dielectric 114. Regions 104 and 106 are created by implanting dopants using, for example, an ion implantation technique. Regions 104 and 106 form the source or drain of the split-gate transistor depending on what potentials are applied to each. In split-gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

Figure 2:
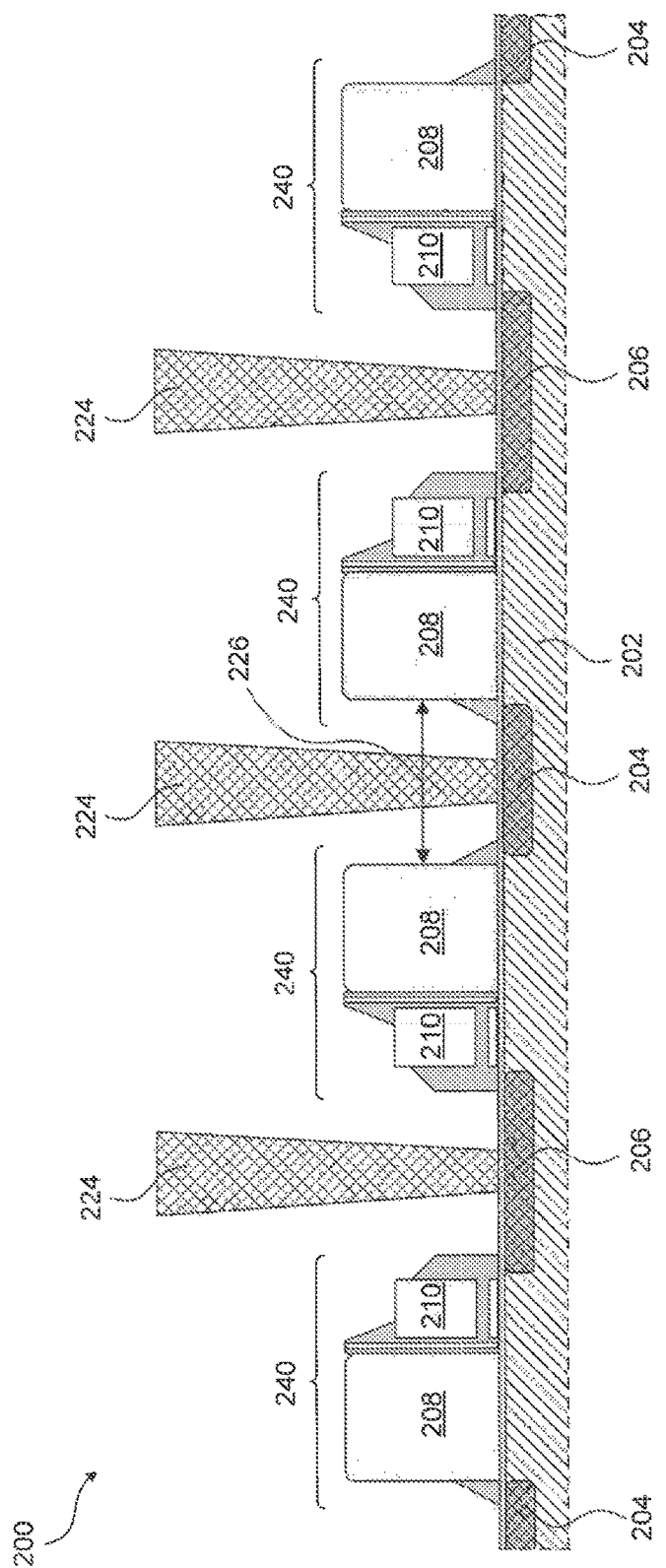
FIG. 2 illustrates a plurality of conventional split-gate memory cells in a memory array according to various embodiments.

FIG. 2 depicts a cross-sectional view of a section of a memory array of a conventional split-gate memory device 200 formed on a substrate 202. Memory device 200 includes a plurality of memory cells 240, which are substantially identical. Each memory cell 240 includes a first gate 210 and a second gate 208, wherein the first gate 210 and the second gate 208 are insulated from each other and from the substrate by dielectric strictures. A plurality of contacts 224 provide electrical access to first doped source/drain regions 204 and second source/drain regions 206. The gaps between the gates and the contacts are commonly filled with an insulating material, such as oxide, to provide adequate electrical isolation between the gates and the contacts. The ability to fill the gaps with the insulating material, without any void in the insulating material, is highly dependent on the aspect ratio of the first gates 210 and second gates 208. For example, as shown in FIG. 2, second gates 208 have higher aspect ratio than first gates 210. Decreasing the spacing 226 between two second gates 208 in FIG. 2 may inhibit the ability to fill the gaps between these two gates and the contact with the insulating material without creating any void in the insulating material. In other words, the lower the aspect ratio of the adjacent gates, the closer the gates can be to each other, while allowing proper gap filling. Therefore, what is needed are semiconductor devices and methods for manufacturing them that result in memory cells having gates of relatively low aspect ratio such that the spacing between the adjacent cells can be minimized, while maintaining the required electrical isolation between the gates and the contacts.

Figure 3:
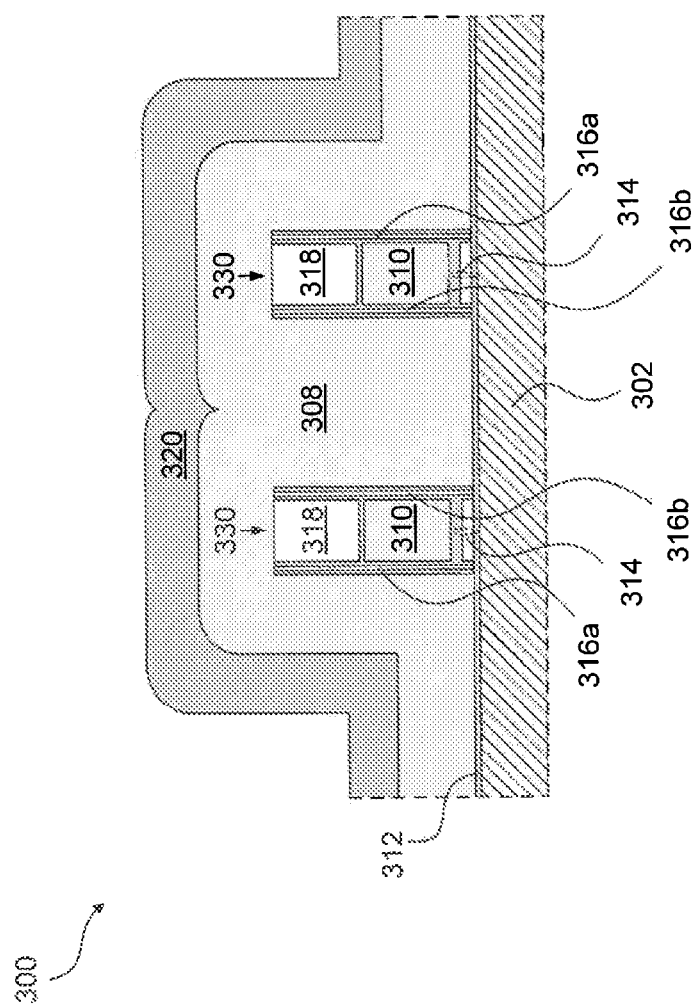
FIGS. 3-9 illustrate a cross-section of a semiconductor device at various points during its manufacture according to various embodiments.

The method for manufacturing an improved memory cell with an L-shaped second gate conductor, according to various embodiments, will now be described with respect of FIGS. 3-9, which depict a cross-section of a semiconductor device 300 at various stages during its production. In FIG. 3, semiconductor device 300 is depicted as having a substrate 302. A dielectric layer 312 is formed on substrate 302 and comprises, for example, but is not limited to, an oxide layer. A pair of substantially identical gate stacks 330 is formed on dielectric layer 312. Each gate stack 330 comprises a first gate conductor 310, a gate dielectric structure 314 and a masking layer 318. The present disclosure is not limited to any particular method of producing the gate stacks 330. Indeed the spirit and scope of the invention includes any appropriate method for forming gate stacks 330, as would become apparent to persons of ordinary skill in the semiconductor manufacturing arts and based on this disclosure.

First gate conductor 310 may comprise any suitable material such as poly. Gate dielectric structure 314 can be disposed above the substrate 302 and beneath first gate conductor 310. According to various embodiments, gate dielectric structure 314 comprises one or more layers of dielectric such as ONO, as described above. Regardless of the specific composition of the gate dielectric structure 314, it preferably contains at least one charge-trapping layer. The charge-trapping layer may be formed of a nitride or silicon rich nitride, and may include multiple layers of different nitrides according to some embodiments. Alternatively, the dielectric layer may comprise a single layer of dielectric material such as an oxide, nitride, or some combination thereof.

FIG. 3 further illustrates dielectric structures 316a and 316b formed on sidewalk of gate stack 330. Dielectric structures 316a and 316b may each comprise one or more layers such as ONO, as described above. Alternatively, dielectric structures 316a and 316b may comprise a single layer of dielectric material such as an oxide, nitride, or some combination thereof. As will be shown later, dielectric structure 316a will form the inter-gate dielectric structure of a memory cell. Also shown in FIG. 3 is a poly layer 308 disposed over gate stacks 330, dielectric structures 316a and 316b and dielectric layer 312. An oxide layer 320 is subsequently disposed over poly layer 308.

Figure 4:
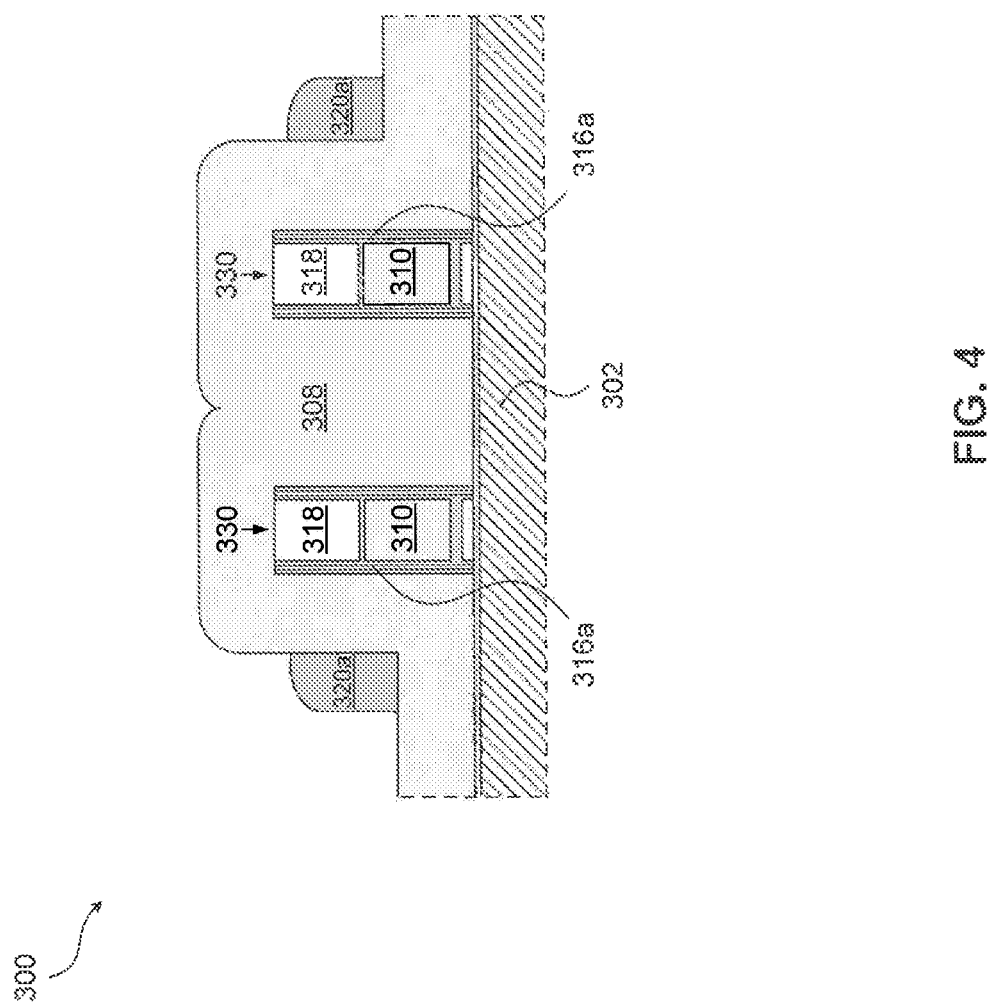
Figure 5:
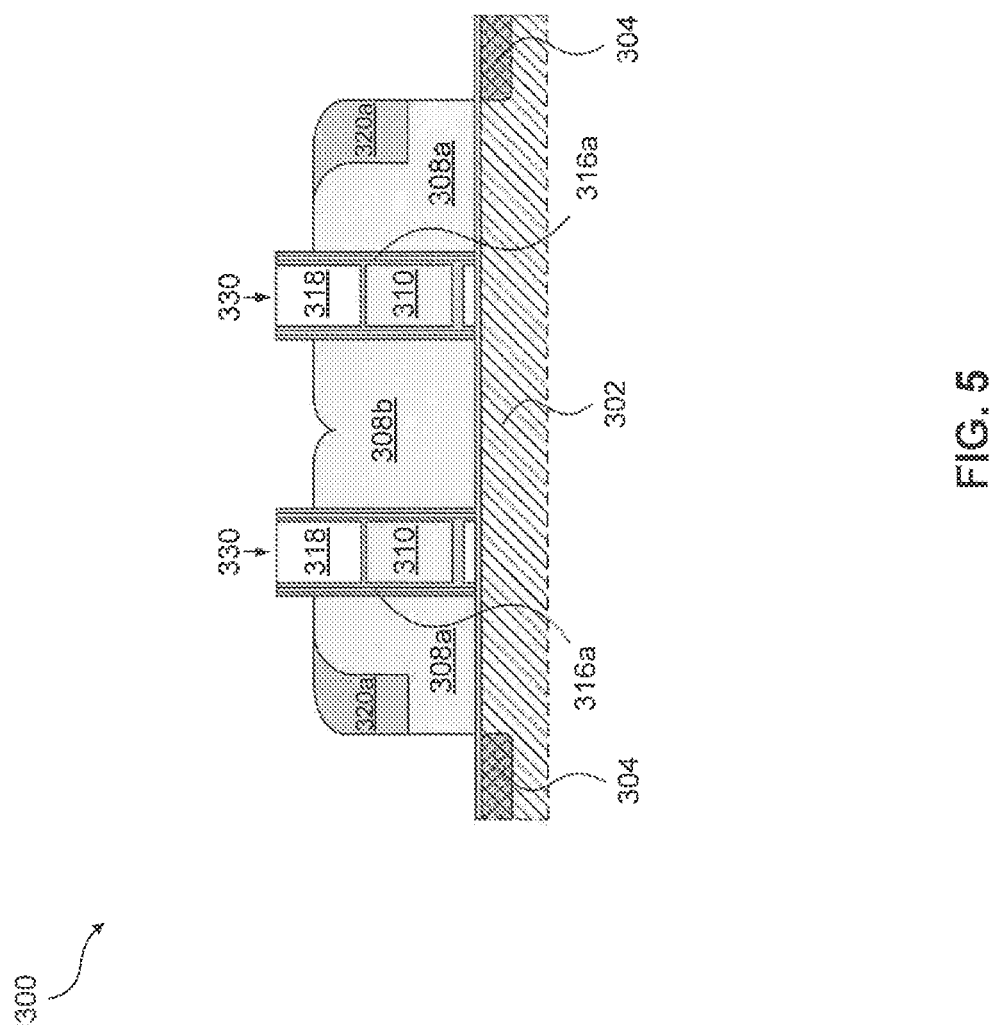
Figure 6:
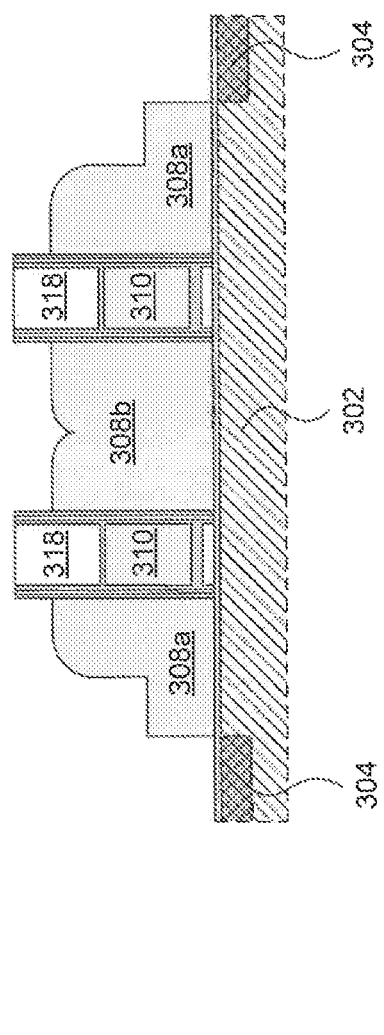

FIG. 4 depicts device 300 at a further point in the production process, where oxide layer 320 can be selectively etched to form oxide spacers 320a on portions of the poly layer 308 adjacent to dielectric structures 316a. In FIG. 5, oxide spacers 320a are used as masks during art etch of poly layer 308, leaving behind L-shaped poly structures 308a adjacent to dielectric structures 316a and poly structure 308b between the gate stacks 330. As will be shown later, L-shaped poly structure 308a will form an L-shaped second gate conductor of a memory cell. At this point in the fabrication process, substrate 302 may be implanted to form doped regions 304. Oxide spacers 320a are removed as shown in FIG. 6, using, for example, but not limited to, a wet etch process.

Figure 7:
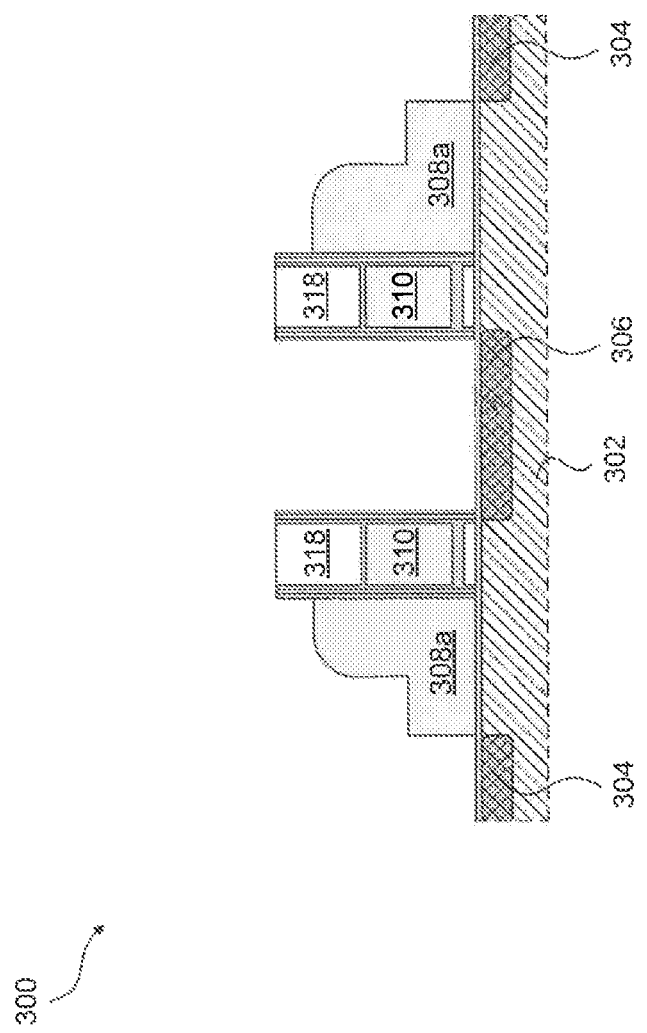
Figure 8:
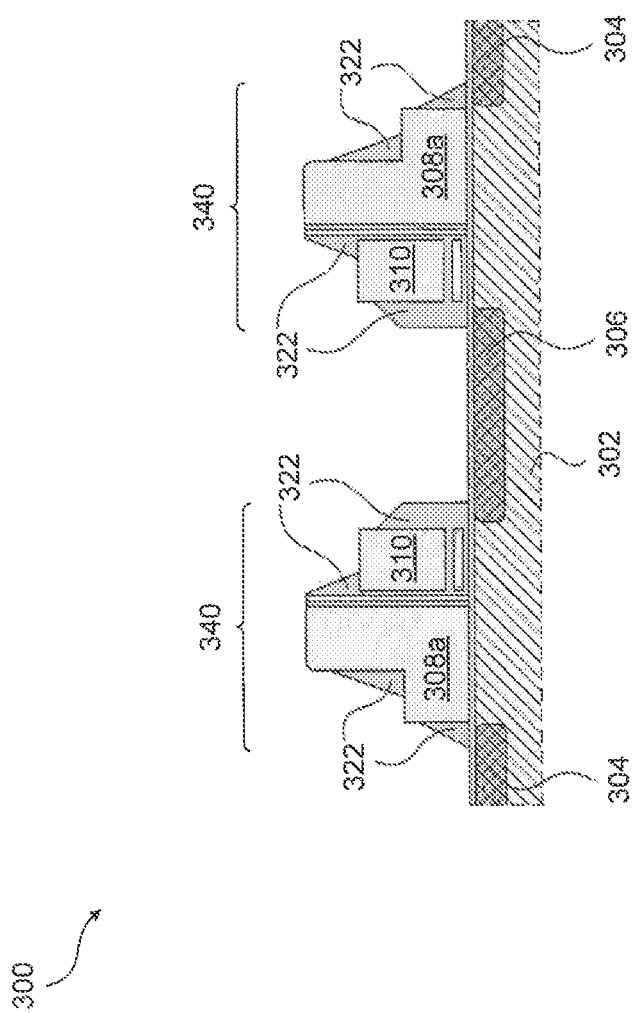

FIG. 7 shows device 300 at an even further stage in the production process, where, after subsequent masking and etching steps (not shown), poly structure 308b can be removed and substrate 302 can be implanted to form doped region 306. In FIG. 8, masking layers 318 can be removed and spacers 322 can be formed, according to a number of known methods, on the walls of first gate conductors 310 and L-shaped second gate conductors 308a. At this point, a pair of memory cells 340 is effectively formed. According to various embodiments, first gate conductor 310 may be used to make a memory gate and L-shaped second gate conductor 308a to make a select gate of a split-gate memory cell. Accordingly, doped region 304 becomes the drain and doped region 306 becomes the source of the split-gate memory cell.

Figure 9:
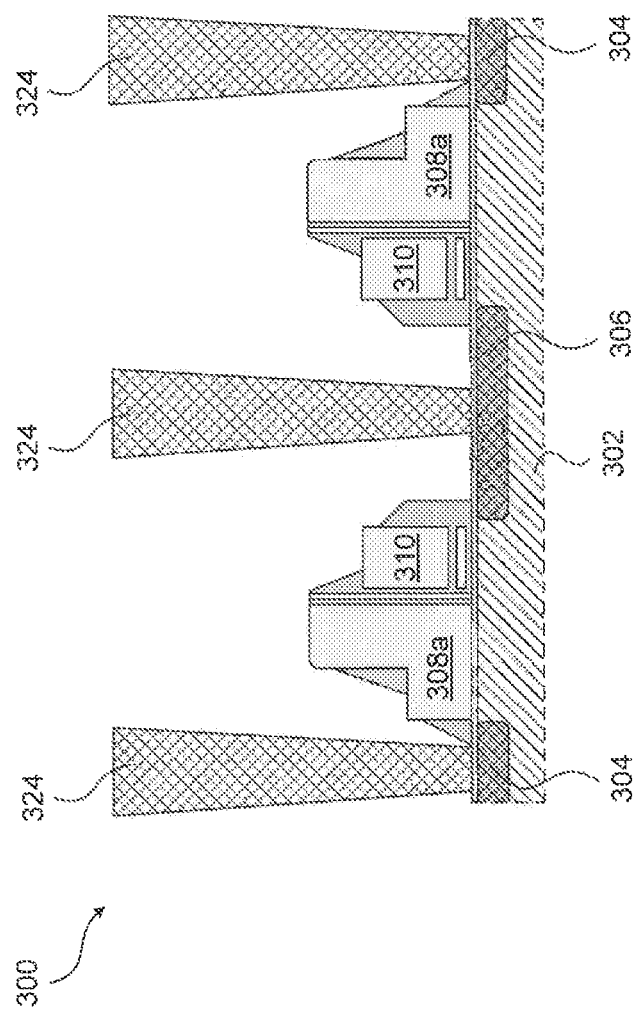
Figure 10:
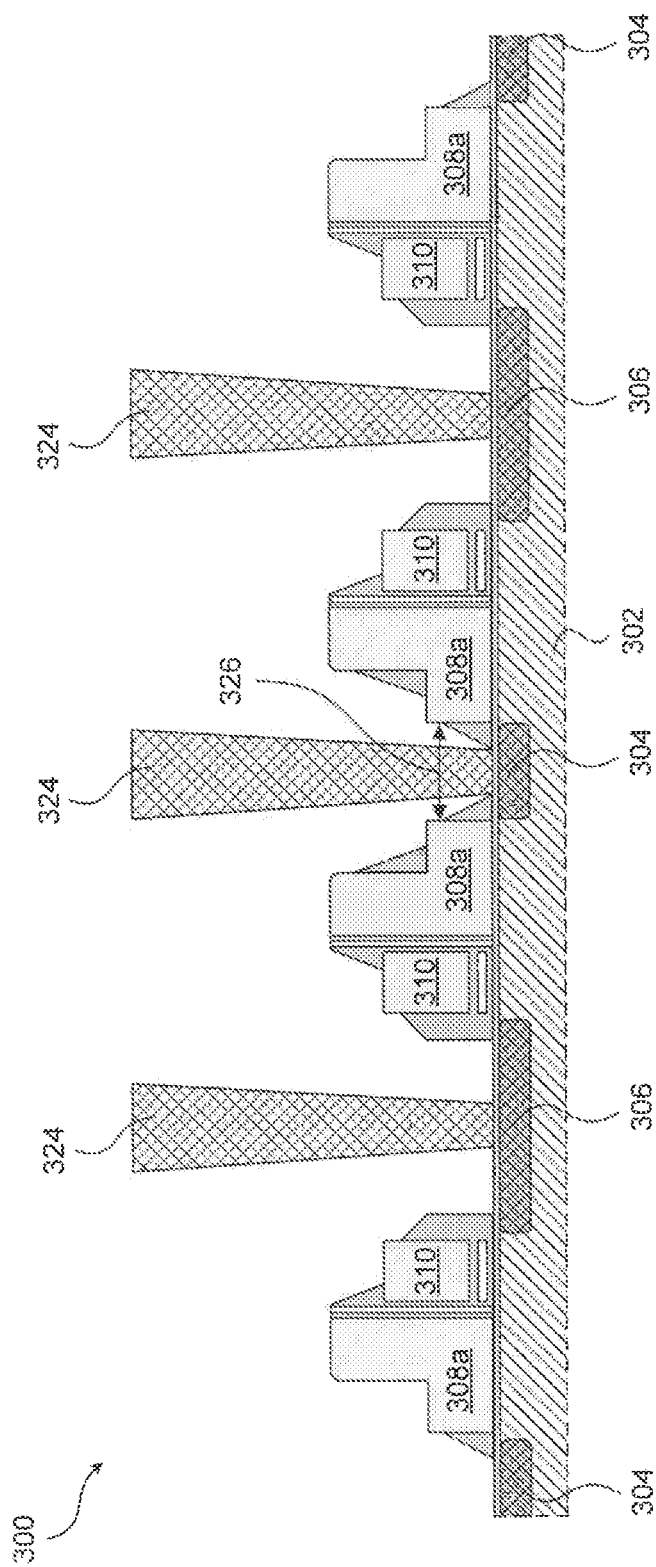
FIG. 10 illustrates a plurality of split-gate memory cells in a memory array according to various embodiments.

In FIG. 9, contacts 324 are formed to provide electrical access to doped regions 304 and 306. FIG. 10 depicts a wider section of device 300, comprising four memory cells with the L-shaped second gates. As shown in FIG. 10, spacing 326 between two L-shaped second gates is narrower compared to spacing 226 in FIG. 2. In other words, the L-shaped second gates provide the desired low aspect ratio, allowing the second gates to be closer to one another. This approach also allows the gaps between the gates and the contacts to be filled with insulating material without creating any void in the insulating material.

It should be understood that, for ease of explanation, FIGS. 3-10 depict a simplified version of device 300 with only two or four memory cells. A person of ordinary skill in the art, however, would understand that device 300 could contain a large number of memory cells and other components.

Figure 11:
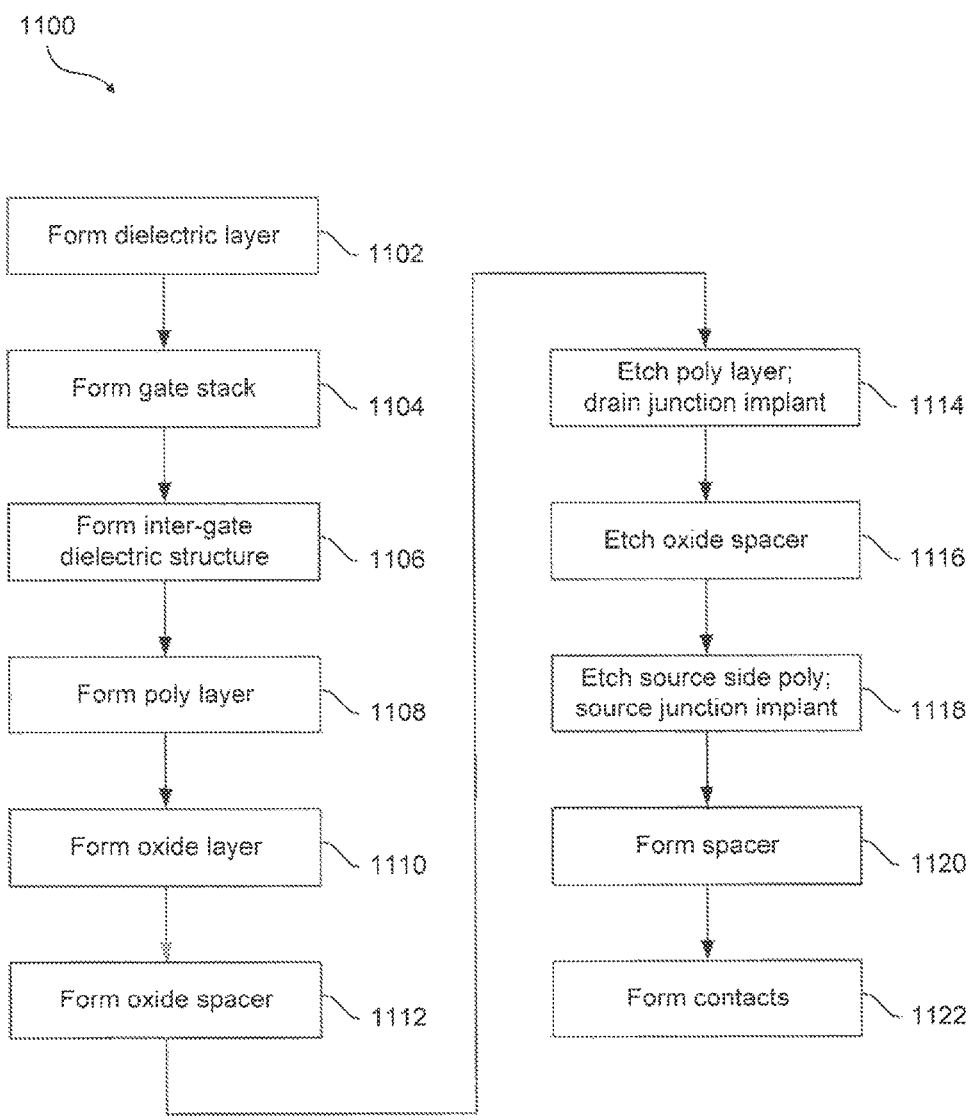
FIG. 11 is a flowchart depicting a method of manufacturing a semiconductor device according to various embodiments.

FIG. 11 depicts a method 1100 of manufacturing a semiconductor device such as device 300 according to various embodiments. The discussion of FIG. 11 will make reference to FIGS. 3-9, but it should be understood that method 1100 is not limited to the specific embodiments depicted in FIGS. 3-9, but is more generally applicable.

As shown in FIG. 11, method 1100 begins at step 1102 by forming a dielectric layer dielectric layer 312) on a substrate 302. At step 1104, gate stack 330 is formed on dielectric layer 312. Gate stack 330 includes a first gate conductor 310 and a gate dielectric structure 314. Gate dielectric structure 314 may comprise one or more layers and preferably contains at least one charge-trapping layer. At step 1106, an integrate At step 1106, an inter-gate dielectric structure (e.g., dielectric structure 316a or 316b) is formed on one of the side is of gate stack 330. Poly layer 308 is formed at step 1108, followed by the formation of oxide layer 320 at step 1110. At step 1112, oxide spacer 320a is formed on a portion of poly layer 308 by selectively etching oxide layer 320. At next step 1114, oxide spacer 320a is used as a mask to etch poly 308 to effectively form an L-shape second gate conductor 308a on one side of gate stack 330 and leaving behind poly portion 308b on the other side of gate stack 330. In addition, at step 1114, substrate 302 is implanted to form drain junction 304. Oxide spacer 320a is etched at step 1116 and poly portion 308b is etched at step 1118, during which the substrate is further implanted to form source junction 306. At step 1120, spacers 322 are formed on the walls of first gate-conductor 310 and L-Shaped second gate conductor 308a. At step 1122, contacts 324 are formed to provide electrical access to drain junction 304 and source junction 306.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance. Additionally, it should be understood that none of the examples or explanations contained herein are meant to convey that the described embodiments have been actually-reduced to practice.

The breadth and scope of the present invention should not be limited by any of the above-described exemplary embodiments, but should be defined only in accordance with the following claims and their equivalents.

What is claimed:

1. A semiconductor device, comprising:
   a substrate;
   a first dielectric layer disposed on the substrate;
   a first gate stack disposed over the first dielectric layer comprising a first gate conductor and a gate dielectric structure disposed on the dielectric layer between the first gate conductor and the dielectric layer, wherein the gate dielectric structure comprises a dielectric charge-trapping layer;
   a second gate conductor disposed over the first dielectric layer, wherein the second gate conductor is configured as an L shape and wherein a vertical portion of the second gate conductor is adjacent to the first gate stack and a horizontal portion of the second gate conductor is on an opposite side of the second gate conductor from the first gate stack; and
   an inter-gate dielectric structure disposed between the first gate conductor and the second gate conductor,
   wherein the first gate conductor is configured to be a memory gate and the second gate conductor is configured to be a select gate of a memory cell.

2. The semiconductor device of claim 1, wherein the first gate conductor comprises polysilicon.

3. The semiconductor device of claim 1, wherein the gate dielectric structure comprises one or more alternating layers of oxide and nitride dielectric films.

4. The semiconductor device of claim 1, wherein the inter-gate dielectric structure comprises two or more dielectric films disposed in alternating layers.

5. The semiconductor device of claim 1, wherein the second gate conductor comprises polysilicon.

6. The semiconductor device of claim 1, further comprising a first doped region in the substrate adjacent to the horizontal portion of the second gate conductor and a second doped region in the substrate adjacent to the opposite side of the first gate stack from the second gate conductor.

7. The semiconductor device of claim 1, further comprising a first spacer disposed on a sidewall of the horizontal portion of the second gate conductor and a second spacer disposed on a sidewall of an opposite side of the first gate stack from the second gate conductor.

8. The semiconductor device of claim 6, further comprising a contact electrically coupled to the first doped region.

9. The semiconductor device of claim 8, further comprising an insulating material disposed over the substrate and between the second gate conductor and the contact, wherein the insulating material comprises no voids.

10. The semiconductor device of claim 9, wherein the insulating material comprises oxide.

11. A memory array, comprising:
    a substrate;
    a first dielectric layer disposed over the substrate; and
    at least two memory devices, each comprising:
      a first gate stack disposed over the first dielectric layer comprising a first gate conductor and a gate dielectric structure disposed between the first gate conductor and the first dielectric layer;
      a second gate conductor disposed over the first dielectric layer, wherein the second gate conductor is configured as an L shape and wherein a vertical portion of the second gate conductor is adjacent to the first gate stack and a horizontal portion of the second gate conductor is on an opposite side of the second gate conductor from the first gate stack; and
      an inter-gate dielectric structure disposed between the first gate conductor and the second gate conductor;
      a spacer disposed on a sidewall of the horizontal portion of the second gate conductor and on a sidewall of an opposite side of the first gate stack from the second gate conductor;
      a doped region in the substrate adjacent to the opposite side of the first gate stack from the second gate conductor;
      a contact electrically coupled to the doped region; and
      an insulating material disposed over the substrate between the contact and the spacer on the sidewall of the first gate stack,
    wherein the insulating material comprises no voids,
    wherein a first memory device and a second memory device are disposed such that the horizontal portion of the second gate conductor of the first memory device is adjacent to the horizontal portion of the second gate conductor of the second memory device, and
    wherein the first gate conductor is configured to be a memory gate and the second gate conductor is configured to be a select gate of a split gate memory cell.

12. The memory array of claim 11, wherein the first gate conductor comprises polysilicon.

13. The memory array of claim 11, wherein the gate dielectric structure comprises one or more alternating layers of oxide and nitride dielectric films.

14. The memory array of claim 11, wherein the gate dielectric structure comprises a charge-trapping layer.

15. The memory array of claim 11, wherein the inter-gate dielectric structure comprises two or more dielectric films disposed in alternating layers.

16. The memory array of claim 11, wherein the second gate conductor comprises polysilicon.

17. The memory array of claim 11, wherein the insulating material comprises oxide.

18. The semiconductor device of claim 1, wherein the first gate conductor comprises a symmetric profile about an axis perpendicular to the first dielectric layer over which it is disposed.

19. The memory array of claim 11, wherein the first gate conductor comprises a symmetric profile about an axis perpendicular to the first dielectric layer over which it is disposed.

20. A split gate memory cell, comprising:
    a memory gate on a gate dielectric structure disposed over a surface of a substrate, the gate dielectric structure comprising a dielectric charge-trapping layer;
    a select gate on a dielectric layer disposed on the surface of the substrate, wherein the select gate is configured as an L shape and wherein a vertical portion of select gate is adjacent to the memory gate and a horizontal portion of the select gate is on an opposite side of the select gate from the memory gate;

an inter-gate dielectric structure disposed between memory gate and the select gate;

a spacer disposed on a sidewall of the horizontal portion of the select gate and on a sidewall of an opposite side of the memory gate from the select gate; and a doped region in the substrate adjacent to the opposite side of the memory gate from the select gate;

a contact electrically coupled to the doped region; and an insulating material disposed over the substrate between the contact and the spacer on the sidewall of the memory gate, wherein the insulating material comprises no voids.

21. The split gate memory cell of claim 20, wherein the gate dielectric structure comprises an oxide-nitride-oxide (ONO) stack disposed on the dielectric layer disposed on the surface of the substrate.

* * * * *